(12) United States Patent
Chen et al.

(10) Patent No.: US 10,462,928 B2
(45) Date of Patent: Oct. 29, 2019

(54) COMPOSITE CABLE ASSEMBLY AND SERVER HAVING THE SAME

(71) Applicant: Super Micro Computer Inc., San Jose, CA (US)

(72) Inventors: Hsiao-Chung Chen, San Jose, CA (US); Tan-Hsin Chang, San Jose, CA (US); Chia-Cheng Lu, San Jose, CA (US); Chih-Wei Chen, San Jose, CA (US)

(73) Assignee: SUPER MICRO COMPUTER INC., San Jose, CA (US)

(*) Notice: Subject to any disclaimer, the term of this patent is extended or adjusted under 35 U.S.C. 154(b) by 1 day.

(21) Appl. No.: 15/821,939

(22) Filed: Nov. 24, 2017

(65) Prior Publication Data
US 2019/0166713 A1    May 30, 2019

(51) Int. Cl.
| | |
|---|---|
| *H01B 7/08* | (2006.01) |
| *H05K 7/14* | (2006.01) |
| *H05K 9/00* | (2006.01) |
| *H01R 12/70* | (2011.01) |
| *H01B 9/00* | (2006.01) |

(52) U.S. Cl.
CPC ............ *H05K 7/1491* (2013.01); *H01B 7/08* (2013.01); *H01B 7/0823* (2013.01); *H01B 9/003* (2013.01); *H01R 12/7076* (2013.01); *H05K 7/1487* (2013.01); *H05K 9/0098* (2013.01); *H01B 7/0838* (2013.01); *H01B 7/0861* (2013.01); *H01B 7/0869* (2013.01)

(58) Field of Classification Search
CPC ............... H05K 7/1491; H05K 7/1487; H01R 12/7076; H02G 7/10; H01B 7/08; H01B 7/0823; H01B 7/0838; H01B 7/0861; H01B 7/0869
See application file for complete search history.

(56) References Cited

U.S. PATENT DOCUMENTS

| | | | | |
|---|---|---|---|---|
| 3,448,346 A * | 6/1969 | McHaffie | ............ | H02G 11/006 174/69 |
| 6,101,695 A * | 8/2000 | Nakamura | ........... | H01R 43/052 29/33 M |
| 6,753,476 B1 * | 6/2004 | Kuniyoshi | ........... | C08K 5/5205 174/110 R |
| 7,037,569 B2 * | 5/2006 | Curro | ........................ | A47L 1/15 428/134 |

(Continued)

*Primary Examiner* — Steven T Sawyer
*Assistant Examiner* — Paresh H Paghadal
(74) *Attorney, Agent, or Firm* — Chun-Ming Shih; HDLS IPR Services (57) ABSTRACT

A composite cable assembly includes flat cables, a cable unit and fastening units. Each flat cable includes conductor assemblies and a shielding layer covering the conductor assemblies. The cable unit includes transmission lines. The transmission lines are arranged horizontally and in contact with the shielding layer of the flat cable closest to the transmission lines. The cable unit contacts the flat cable closest to the cable unit, the cable unit and each flat cable are together bent to form bent portions and extension sections connected to the bent portions. Each two fastening units are arranged spaced apart at two sides of a corresponding bent portion. Each extension section has the same length when the cable unit and each flat cable are moved in a movement direction to extend or collapse.

8 Claims, 7 Drawing Sheets

(56) References Cited

U.S. PATENT DOCUMENTS

| | | | |
|---|---|---|---|
| 2009/0314515 A1* | 12/2009 | Bevirt | H01B 7/40 |
| | | | 174/110 R |
| 2010/0072657 A1* | 3/2010 | Lind | H02G 3/0462 |
| | | | 264/171.13 |
| 2011/0116226 A1* | 5/2011 | Yang | H05K 7/1487 |
| | | | 361/679.48 |
| 2014/0014406 A1* | 1/2014 | Gundel | H01B 7/0861 |
| | | | 174/350 |

* cited by examiner

COMPOSITE CABLE ASSEMBLY AND SERVER HAVING THE SAME

TECHNICAL FIELD

The present invention relates to a composite cable assembly and, in particular, to a composite cable assembly for managing cables without extra components and to a server having the composite cable assembly.

BACKGROUND

In a commonly-used large server cabinet, there are multiple computer hosts and multiple storage modules. Wires and cables are connected between the storage modules and the computer hosts. By moving the storage modules back and forth, operators can repair or replace components conveniently. However, this may lead to messy, disorganized, or entangled cables/wires, and the entangled or messy cables/wire may interfere with other components and cause problems in maintenance or repair. The server cabinets nowadays utilize a removable cable arm for receiving and managing the cable/wires.

The problem is that, due to insufficient space in the server cabinet, it is difficult to place the cable arm having a pivot member and/or a chain inside the server cabinet. Moreover, installation of a cable arm increases costs. Alternatively, a fastening element which fastens cables/wires simply by a strap or an adhesive tape is used. However, after the wires/cables are frequently dragged back and forth to extend or collapse, some portions of the cables/wires, i.e. the portions which are not fixed by the fastening strap, tend to have shifting or deformation problems between the cables/wires, thus interfering with other components, and affect signal transmission or power delivery quality. In addition to that, the strap or the adhesive tape has a short lifespan, so problems such as inferior fastening effect and messy cables/wires and troublesome maintenance tend to occur.

In views of this, in order to solve the above disadvantage, the inventor studied related technology and provided a reasonable and effective solution in the present disclosure.

SUMMARY

It is an objective of the present invention to provide a composite cable assembly and a server having the same, which has a structure with flexibility and sufficient rigidity (i.e. characteristics of a flat cable) and also reduces costs.

Accordingly, the present invention provides a composite cable assembly which includes a plurality of flat cables, a cable unit, and a plurality of fastening units. The flat cables overlap each other, each flat cable includes a plurality of conductor assemblies and a shielding layer which covers the conductor assemblies. The cable unit includes a plurality of transmission lines arranged horizontally and in contact with the shielding layer of the flat cable in closest proximity to the transmission lines, wherein the cable unit is in contact with the flat cable in closest proximity to the cable unit, and the cable unit and each flat cable are together bent to form a plurality of bent portions and a plurality of extension sections connected to the bent portions. Each two fastening units are arranged in spaced-apart relationship at two sides of a respective corresponding one of the bent portions, and each extension section has the same length when the cable unit and each flat cable are moved in a movement direction of the composite cable assembly to extend or collapse.

The present invention further has the following functions. The overlapping flat cables are made of soft or flexible metal foil. The metal foil is selected from a group consisting of copper, silver, aluminum, gold or alloy thereof. Due to the material characteristics of the flat cable, its whole structure has good flexibility and sufficient rigidity. Each conductor assemblies are so arranged to form a shielded cable with a cross-section of a flat cable structure. When the composite cable assembly is moved back and forth, the cable unit is also moved back and forth along with the flat cables. The movement does not cause shifting or deformation between the flat cables and the cable unit. Thus, the present invention can be used in a tiny space and reduce costs.

Accordingly, the present invention provides a server which includes a chassis and a composite cable assembly. The chassis includes a tray, a calculation module disposed on the tray, a storage module moved with respect to the calculation module, and an accommodating space between the calculation module and the storage module. The composite cable assembly is disposed in the accommodating space and is electrically connected to the calculation module and the storage module, wherein the composite cable assembly is moved by movement of the storage module to extend or collapse.

When the storage module is moved in the movement direction on the tray, the bent portions of the composite cable assembly have an overlapped arc structure, so that the flat cables and the cable unit can be moved back and forth without causing shifting or deformation therebetween. Compared to conventional techniques like a cable arm, the present invention has a small size, reduces component costs, achieves good cable management, and can be used in a smaller space in a server.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Figure 1:
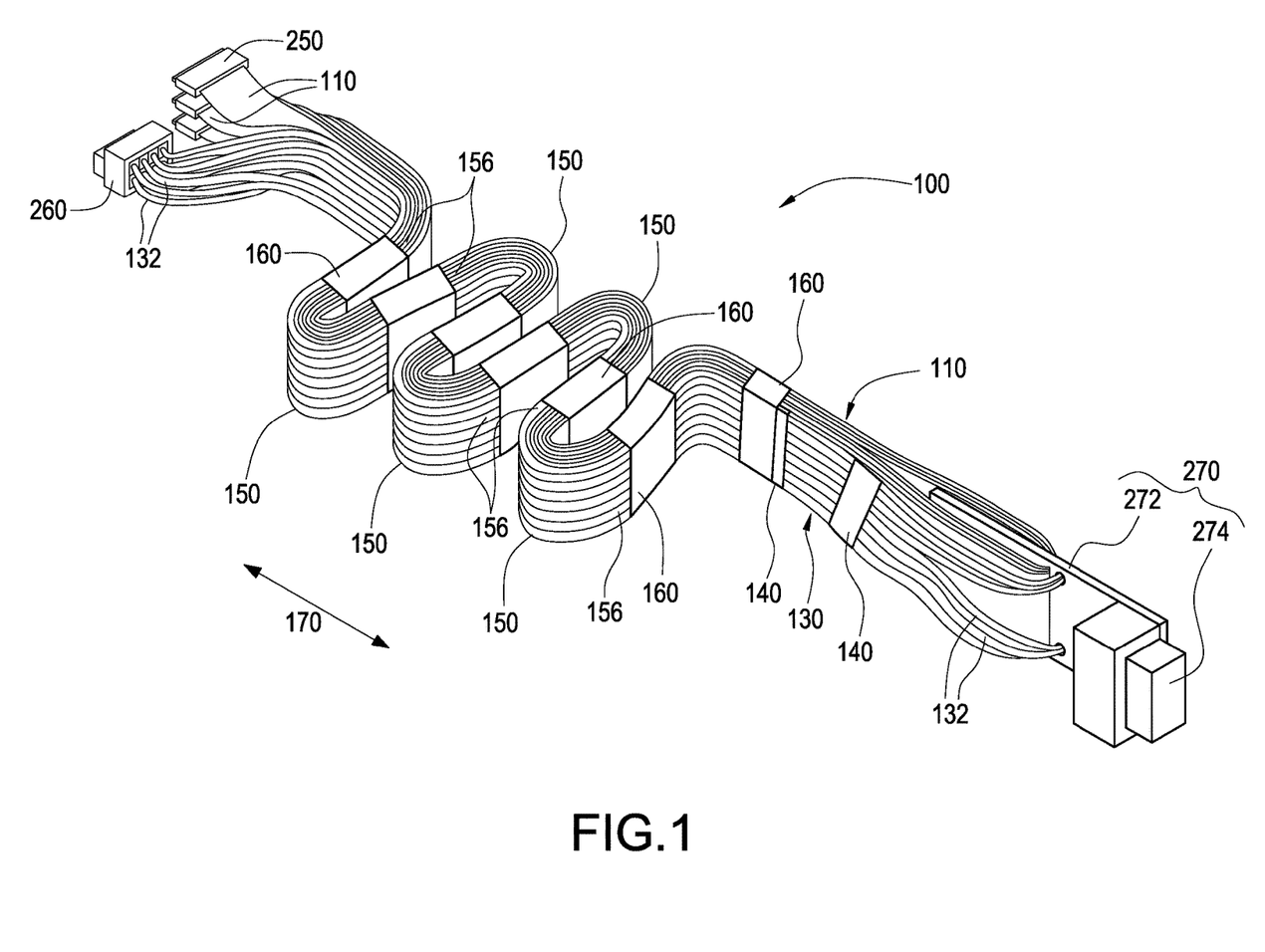
FIG. 1 is a perspective view illustrating a composite cable assembly according to the present invention.
Figure 2:
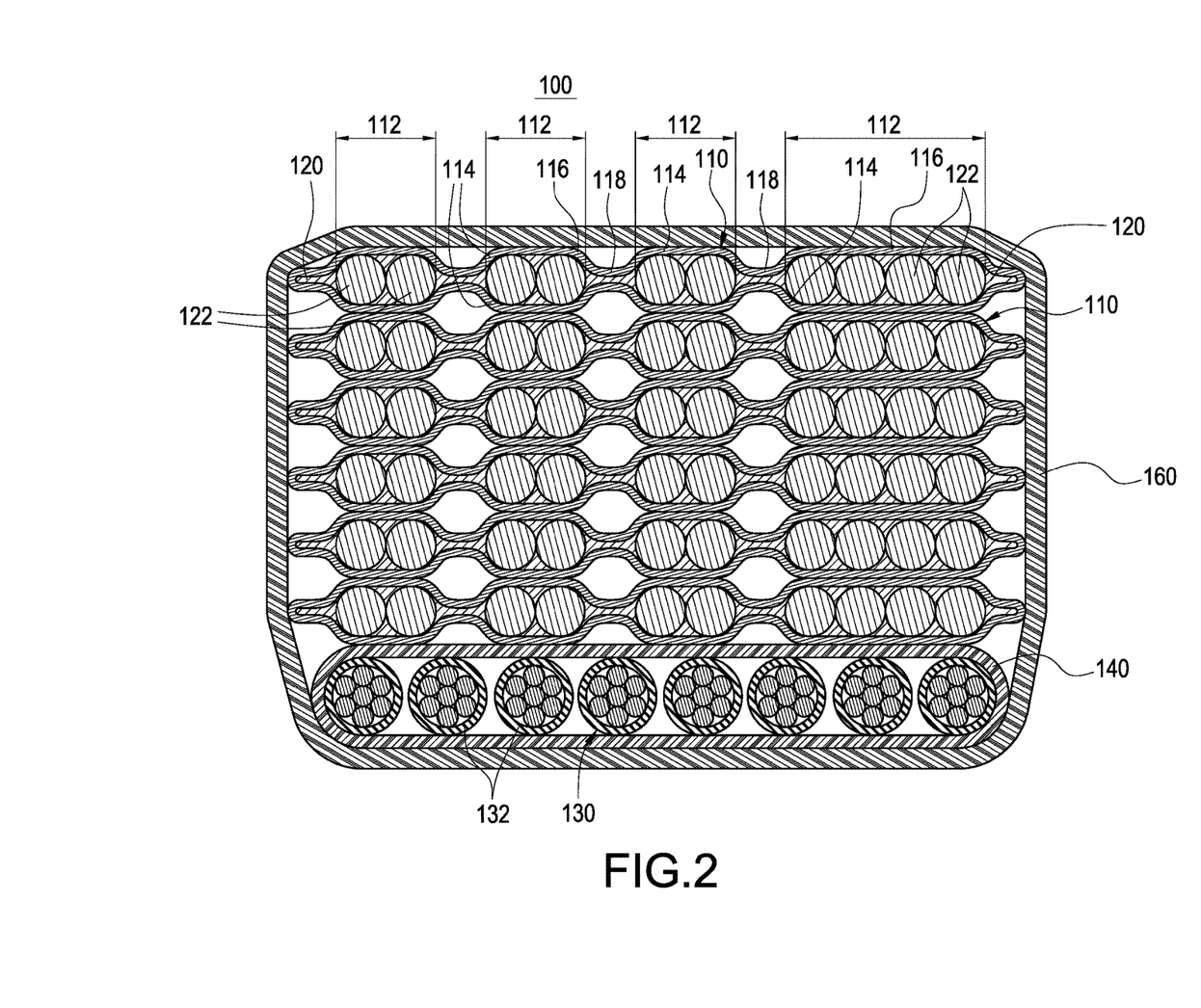
FIG. 2 is a cross-sectional view illustrating the composite cable assembly.

As shown in FIGS. 1 and 2, the present invention provides a composite cable assembly 100. The composite cable assembly 100 includes a plurality of flat cables 110, a cable unit 130, and a plurality of fastening units 160. The flat cables 110 overlap each other. Each flat cable includes a plurality of conductor assemblies 112 and a shielding layer 114 covering the conductor assemblies 112. The conductor assemblies 112 extend along a longitudinal direction of the flat cable 110, and are arranged spaced apart in a widthwise direction of the flat cable 110.

In the present embodiment, the composite cable assembly 110 preferably includes six flat cables 110, and the number of the flat cables 110 may vary as needed, the present invention is not limited in this regard. As shown in FIG. 2, each shielding layer 114 preferably includes a plurality of covering portions 116 and a plurality of pinched portions 118. The covering portions 116 and the pinched portions 118 in combination surround and cover the conductor assemblies 112. Each conductor assembly 112 includes one or more conductors 122. The conductor 122 consists of a high conductive material such as copper, gold or alloy thereof. Each flat cable 110 includes an adhesive layer 120. The adhesive layer 120 is spread between the shielding layer 114 and the conductor assemblies 112, so that the shielding layer 114 is tightly adhered to form each pinched portion 118.

The adhesive layer 120 can be spread on one or two inner sides of the covering portion 116 and the pinched portion 118, so that each conductor assembly 112 is tightly fixed inside the shielding layer 114, and the conductor assemblies 112 are so arranged to form a shielded cable with a cross-section of a flat cable structure. The shielding layer 114 is partially or entirely made of soft or flexible metal foil, and the metal foil is selected from a group consisting of copper, silver, aluminum, gold or alloy thereof. Due to the material characteristics of the flat cable 110, the whole structure of the composite cable assembly 100 has good flexibility and sufficient rigidity.

In alternative embodiments, each shielding layer 114 can consist of a conductive layer (not illustrated) and a non-conductive layer (not illustrated). The conductive layer consists of any suitable conductive materials such as copper, silver, aluminum, gold, and alloy thereof. The non-conductive layer consists of any suitable polymer materials such as polyethylene terephthalate (PET), polyimide, polyamide-imide, polytetrafluoroethylene, polypropylene, polyethylene, polyphenylene sulfide, polyethylene naphthalate, polycarbonate, silicone rubber, synthetic rubber, polyurethane, acrylic ester, silicone, natural rubber, epoxy resin, and synthetic rubber adhesive.

Moreover, each shielding layer 114 can be constructed differently to meet different expectations such as functionality (e.g. flexibility, electrical efficiency) and configurations (e.g. having or not having a ground wire, the position of the ground wire), so that the conductor assemblies 112 can be isolated, shielded and accurately spaced apart. The adhesive layer 120 consists of, for example, at least one of an insulating adhesive, a pressure sensitive adhesive, a hot melt adhesive, a thermally curable adhesive, and a curable adhesive; however, the constituents of the adhesive layer may vary as needed. When the flat cable 110 is moved in a movement direction 170 of the composite cable assembly 100, the conductors 122 of each conductor assembly 112 are adhered by the adhesive layer 120, thereby preventing the conductors 122 from being detached from the shielding layer 114, and also avoiding shifting or deformation.

The cable unit 130 includes a plurality of transmission lines 132 extending along the longitudinal direction of the flat cable 110. The transmission lines 132 are arranged horizontally and in contact with the shielding layer 114 of the flat cable 110 in closest proximity to the transmission lines 132. The cable unit 130 is in contact with the flat cable 110 in closest proximity to the cable unit 130, the cable unit 130 and each flat cable 110 are together bent to form a plurality of bent portions 150 and a plurality of extension sections 156 connected to the bent portions 150. Each bent portion 150 has a bent angle 152. Each two fastening units 160 are arranged in spaced-apart relationship at two sides of a respective corresponding one of the bent portions 150. Each extension section 156 has the same length when the cable unit 130 and each of the flat cables 110 are moved in the movement direction 170 to extend or collapse.

In the embodiment of FIGS. 1 and 2, each fastening unit 160 is, for example, a heat-shrink tube, a heat-resistant tape, a binding strip, or an adhesive strap to bind two ends of each bent portion 150. According to a length between each two adjacent bent portions 150, one or more additional fastening units 160 can be selectively added for improved fastening effect. Furthermore, in the present embodiment, the composite cable assembly 100 further includes a plurality of protective straps 140 arranged in spaced-apart relationship for binding the cable unit 130. The transmission lines 132 are arranged juxtaposed in a widthwise direction of the composite cable assembly 100 while using the protective straps 140, and then the transmission lines 132 and each flat cable 110 are bound together by means of each fastening unit 160.

Bound by each protective strap 140, the transmission lines 132 are juxtaposed in the widthwise direction of the composite cable assembly 110 and are stacked above the shielding layer 114 of the flat cable 110 in closest proximity to the cable unit 130, so that the cable unit 130 and each cable unit 110 can be moved together at the same time. Each protective strap 140 can be, but not limited to, a heat-shrink tube, a heat-resistant tape, a binding strip, or an adhesive strap.

Referring to FIGS. 3 to 7, when each flat cable 110 and the cable unit 130 are moved to extend in the movement direction 170, a radially-inwardmost arc surface of the composite cable assembly 100 at the bent portion 150 is of larger curvature than a radially-outermost arc surface of the composite cable assembly 100 at the bent portion 150, and an inner arc of each flat cable 110 is shorter than an outer arc of each flat cable 110. At this point, gaps 154 between the flat cables 110 and the cable unit 130 become larger. On the other hand, when each flat cable 110 and the cable unit 130 are moved in the movement direction 170 to collapse, arc surfaces of the flat cables 110 at the bent portion 150 are brought into close contact with each other.

In detail, each extension section 156 of the composite cable assembly 100 is bound by means of adhesive force or friction of each fastening unit 160, so that when the composite cable assembly 110 extends or collapses, each extension section 156 moves a similar distance along the movement direction 170. That is to say, since each fastening unit 160 tightly fastens each flat cable 110 and the cable unit 130 by an adhesive force or friction stronger than a force moving each flat cable 110 and the cable unit 130 in the longitudinal direction, each extension section 156 has the same length when the composite cable assembly 100 is moved along the movement direction 170 to extend or collapse.

Figure 5:
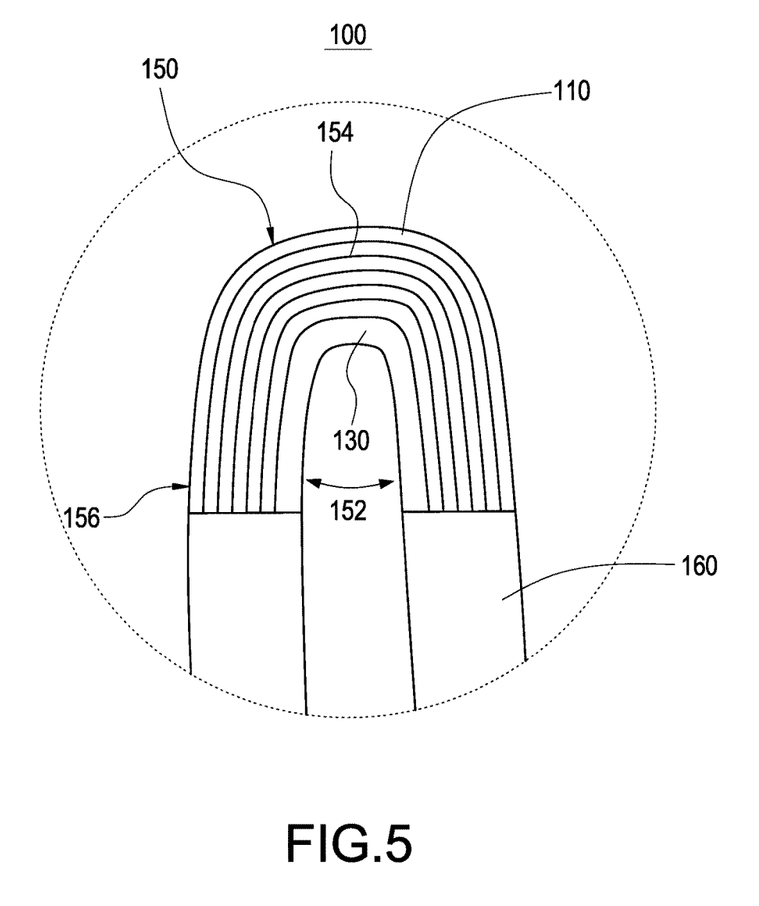
FIG. 5 is a schematic view illustrating a bent portion of FIG. 4.
Figure 7:
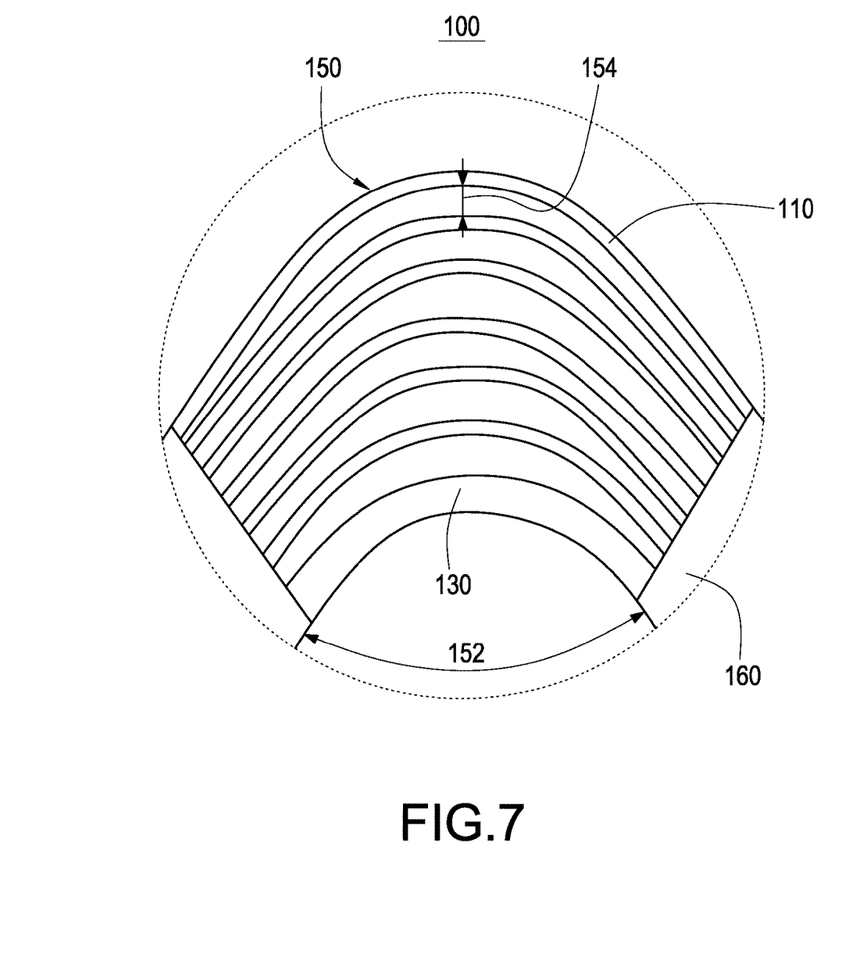
FIG. 7 is a schematic view illustrating one of the bent portions of FIG. 6.

The bent portions 150 are not fastened by the fastening units 160. Therefore, when the composite cable assembly 100 is moved in the movement direction 170 to extend, the gaps 154 between the flat cables 110 and the cable unit 130 at each bent portion 150 vary in size, and an inner arc of each flat cable 110 is shorter than an outer arc of each flat cable 110. On the other hand, when the composite cable assembly 100 is moved in the movement direction 170 to collapse, the gaps 154 become smaller until the flat cables 110 and the cable unit 130 at the bent portion 150 closely contact each other (there exist almost no gaps 154), as shown in FIGS. 5 and 7.

In the present embodiment, each flat cable 110 is a shielded cable for transmitting signals, and each transmission line 132 of the cable unit 130 is a power line for delivering power. However, in alternative embodiments, each conductor assembly 112 of each flat cable 110 and the transmission line 132 of the cable unit 130 can selectively transmit signals and/or power, and this may vary as needed.

Referring to FIGS. 2 to 7, the present invention provides a server 200 which includes a chassis 202 and a composite cable assembly 100. The chassis 202 includes a tray 204, a calculation module 210 disposed on the tray 204, a storage module 220 moved with respect to the calculation module 210, and an accommodating space 230 formed between the calculation module 210 and the storage module 220. The composite cable assembly 100 is disposed in the accommodating space 230 and is electrically connected to the calculation module 210 and the storage module 220, wherein the composite cable assembly 100 is moved by movement of the storage module 220 to extend or collapse.

Figure 3:
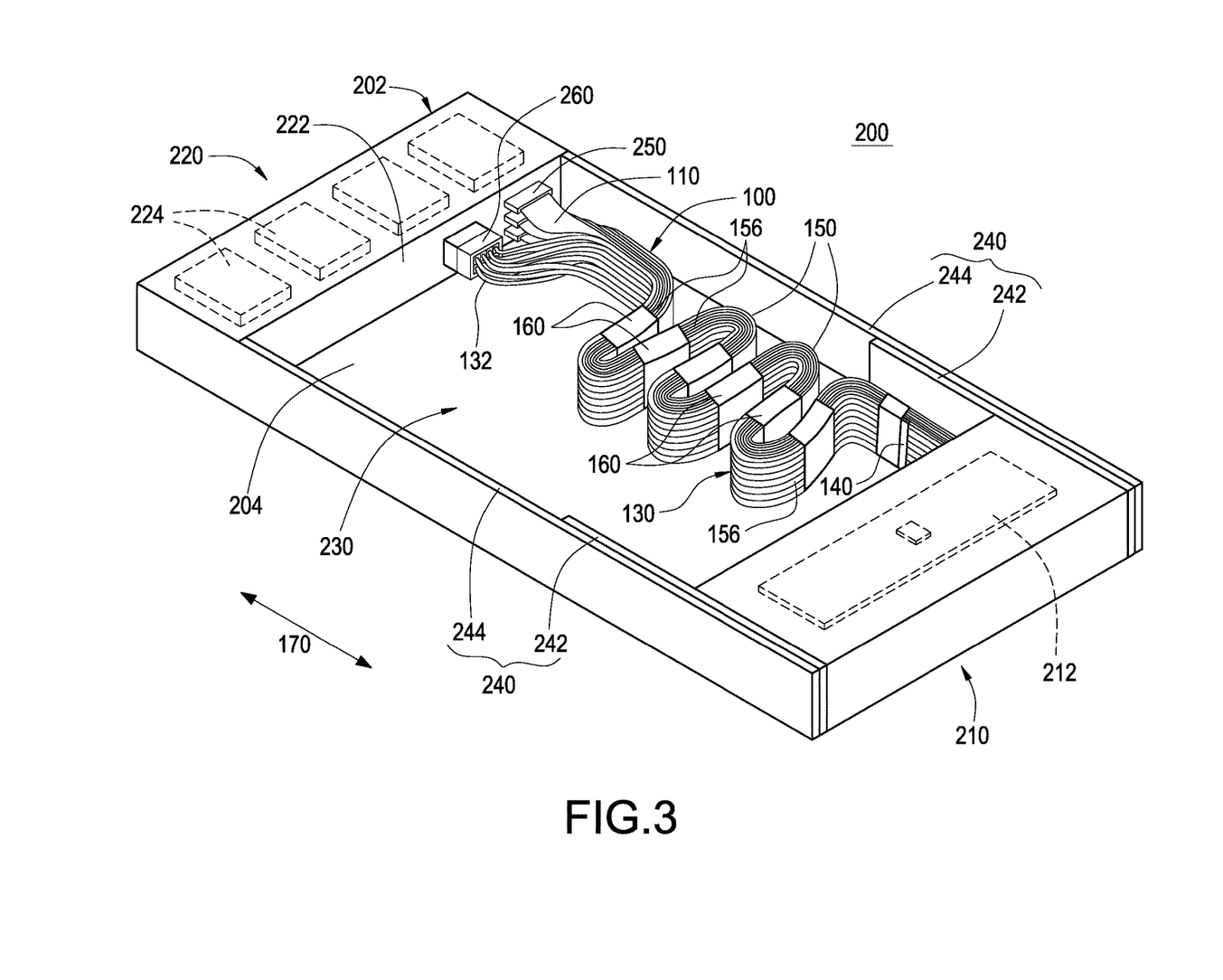
FIG. 3 is a perspective view illustrating the composite cable assembly used in a server.
Figure 4:
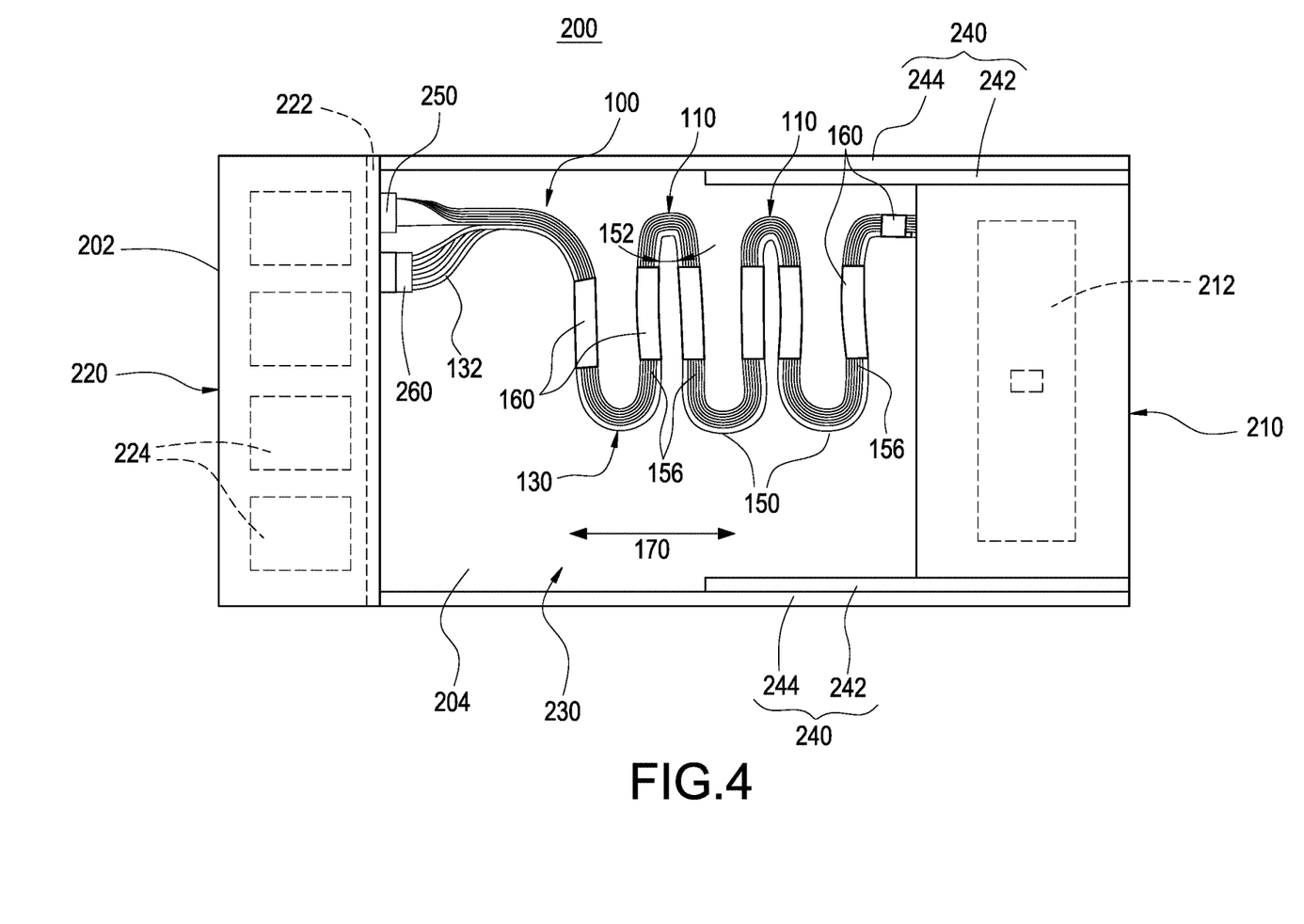
FIG. 4 is a schematic view illustrating the composite cable assembly collapsed and received in the server.
Figure 6:
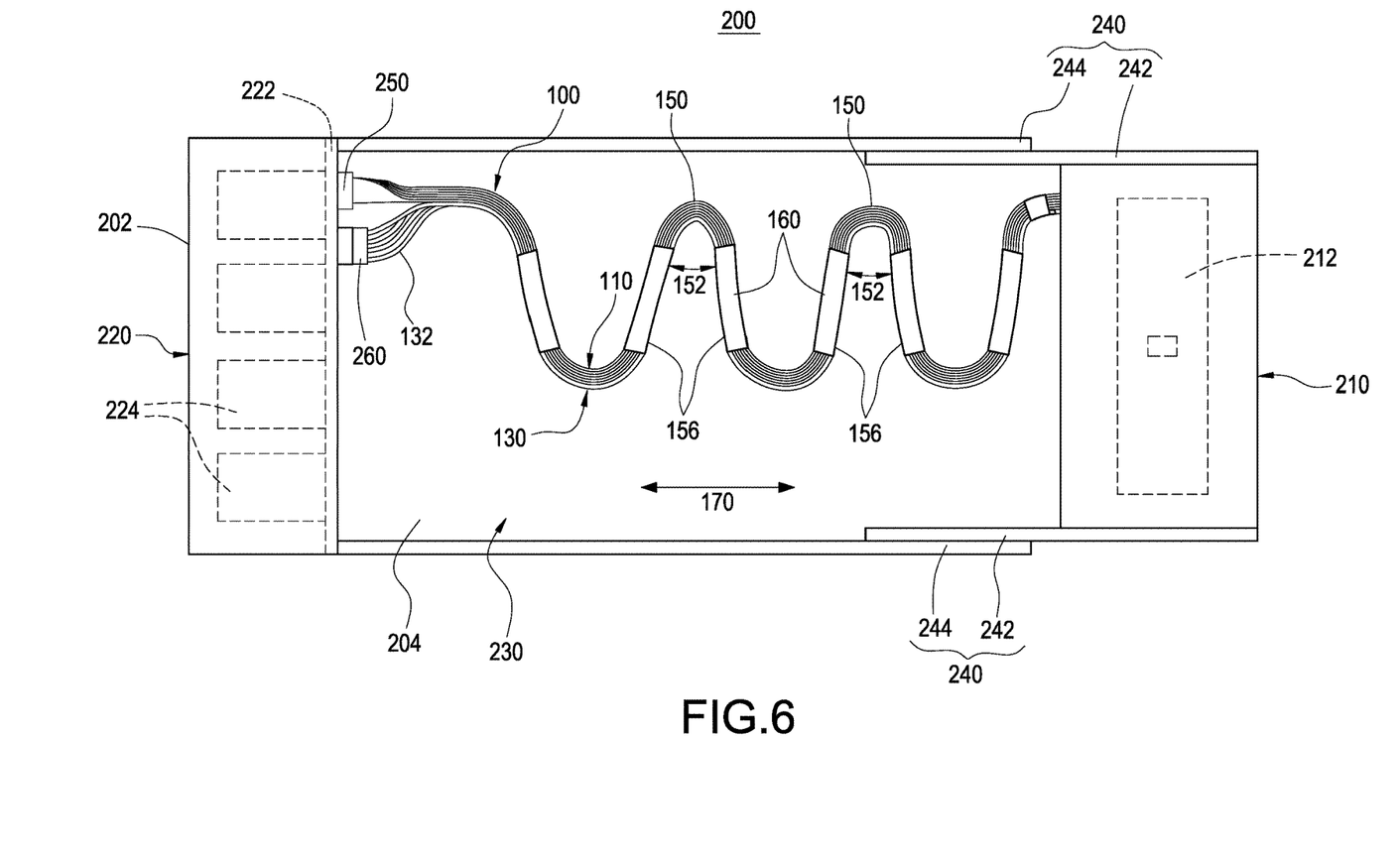
FIG. 6 is a schematic view illustrating that the composite cable assembly is extended in the server.

In the present embodiment, a rail assembly 240 is disposed at two sides of the tray 204. The rail assembly 240 includes two first slide rails 242 and two second slide rails 244 connected to the two first slide rails 242. The two first slide rails 242 are connected at two sides of the calculation module 210. The two second slide rails 244 are connected at two sides of the storage module 220. The second slide rail 244 of the storage module 220 is slidable along the first slide rail 242 with respect to the calculation module 210, so that the composite cable assembly 100 is moved to extend or collapse by sliding the storage module 220.

The calculation module 210 shown in FIGS. 3, 4 and 6 preferably includes a motherboard 212 or other suitable parts. The storage module 220 includes a back plate 222 and a plurality of disk drives 224 electrically connected to the back plate 222. One end of the composite cable assembly 100 includes a plurality of first connectors 250 and a second connector 260, each first connector 250 is connected to each flat cable 110, and the second connector 260 is connected to the cable unit 130. Each first connector 250 and the second connector 260 are electrically connected to the back plate 222.

As shown in FIG. 1, the other end of the composite cable assembly 100 is connected to a connector assembly 270. The connector assembly 270 includes a circuit board 272 electrically connected to each flat cable 110 and the cable unit 130 and includes a third connector 274 electrically connected to the circuit board 272. The third connector 274 is electrically connected to the motherboard 212. The first connector 250, the second connector 260, and the third connector 274 of the connector assembly 270 include, but are not limited to, a cable connector, a circuit board connector, a universal integrated circuit card (UICC), or a smart card connector.

When the storage module 220 is moved in the movement direction 170 on the tray 204, the bent portions 150 of the composite cable assembly 100 have an overlapped arc structure, so that the flat cables 110 and the cable unit 130 can be moved back and forth without causing shifting or deformation therebetween. As a result, the present embodiment has a small size, reduces component costs, achieves good cable management, and facilitates application in a small space in the server 200. The rest structure, connection relationship and functions of the composite cable assembly 100 are described in the foregoing embodiment, so a detailed description thereof is not repeated herein.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A server, comprising:
   a chassis, the chassis including a tray, a calculation module disposed on the tray, a storage module moveably with respect to the calculation module, and an accommodating space between the calculation module and the storage module; and
   a composite cable assembly, comprising:
   a plurality of flat cables, the flat cables overlapping each other, each flat cable including a plurality of conductor assemblies arranged spaced apart and a shielding layer covering the conductor assemblies, wherein the shielding layer includes a plurality of covering portions and a plurality of pinched portions, the covering portions and the pinched portions in combination surround and cover the conductor assemblies, each flat cable further includes an adhesive layer, and the adhesive layer is spread between the shielding layer and the conductor assemblies, so that the shielding layer filled with the adhesive layer is tightly adhered to form each pinched portion;
   a cable unit, the cable unit including a plurality of transmission lines arranged horizontally and in contact with the shielding layer of an outermost one of the flat cables, wherein the cable unit is in contact with the outermost one of the flat cables, the cable unit and each flat cable are together bent to form a plurality of bent portions and a plurality of extension sections connected to the bent portions; and
   a plurality of fastening units, each two fastening units being arranged in spaced-apart relationship at two sides of a respective corresponding one of the bent portions, each extension section having the same length when the cable unit and each of the flat cables are moved in a movement direction of the composite cable assembly to extend or collapse the composite cable assembly,
   wherein each bent portion has a bent angle; and when the flat cable is moved in the movement direction, conductors of each conductor assembly are adhered by the adhesive layer, thereby preventing the conductors from being detached from the shielding layer, and also avoiding shifting or deformation;
   wherein each extension section is bound by adhesive force or friction of each fastening unit, so that when the composite cable assembly extends or collapses, since each fastening unit tightly fastens each flat cable and the cable unit by the adhesive force or friction stronger than a force moving each flat cable and the cable unit in a longitudinal direction;
   wherein the bent portions are not fastened by the fastening units, so when the composite cable assembly is moved in the movement direction to extend, a gap between two adjacent flat cables or between the outermost one of the flat cables and the cable unit at each bent portion varies in size, and when the composite cable assembly is moved in the movement direction to collapse, the gap becomes smaller until the flat cables and the cable unit at the bent portions closely contact each other; and wherein each flat cable is a shielded cable for transmitting a signal, and each transmission line of the cable unit is a power line for delivering power.

2. The server according to claim 1, wherein each of the fastening units is a heat-shrink tube, a heat-resistant tape, a binding strip, or an adhesive strap.

3. The server according to claim 1, further including a plurality of protective straps arranged in spaced-apart relationship for binding the cable unit, the transmission lines being arranged juxtaposed in a widthwise direction of the composite cable assembly by using the protective straps, each protective strap being a heat-shrink tube, a heat-resistant tape, a binding strip, or an adhesive strap.

4. The server according to claim 1, further comprising a plurality of first connectors and a second connector, each first connector is connected to one end of each flat cable, and the second connector is connected to one end of the cable unit.

5. The server according to claim 4, wherein the other end of the composite cable assembly is connected to a connector assembly, and the connector assembly includes a circuit board electrically connected to each flat cable and the cable unit and includes a third connector electrically connected to the circuit board.

6. The server according to claim 1, wherein the shielding layer is partially or entirely made of soft or flexible metal foil, and the metal foil is selected from a group consisting of copper, silver, aluminum, gold or alloy thereof.

7. The server according to claim 1, wherein the storage module includes a back plate and a plurality of disk drives electrically connected to the back plate.

8. The server according to claim 1, wherein when the storage module is moved toward the calculation module, arc surfaces of the flat cables at the bent portion are brought into close contact with each other.

* * * * *